(12) United States Patent  
Joe et al.

(10) Patent No.: US 7,054,360 B2
(45) Date of Patent: May 30, 2006

(54) METHOD AND APPARATUS FOR GENERATING PULSE WIDTH MODULATED WAVEFORMS

(75) Inventors: Jurianto Joe, Singapore (SG); Chwee Mei Wong, Singapore (SG)

(73) Assignee: Cellonics Incorporated Pte, Ltd., Singapore (SG)

(*) Notice: Subject to any disclaimer, the term of this patent is extended or adjusted under 35 U.S.C. 154(b) by 818 days.

(21) Appl. No.: 10/095,557

(22) Filed: Mar. 11, 2002

(65) Prior Publication Data

US 2003/0086488 A1    May 8, 2003

Related U.S. Application Data

(60) Provisional application No. 60/338,781, filed on Nov. 5, 2001.

(51) Int. Cl.
    *H03K 7/08* (2006.01)
(52) U.S. Cl. .......................... 375/238; 341/53
(58) Field of Classification Search ............... 375/238, 375/316, 239, 240, 268, 300; 332/149, 106, 332/109, 112, 115; 370/205, 212, 213; 341/53, 341/64; 455/108
See application file for complete search history.

(56) References Cited

U.S. PATENT DOCUMENTS

| | | |
|---|---|---|
| 3,312,911 A | 1/1964 | De Boer |
| 3,209,282 A | 9/1965 | Schnitzler |
| 3,239,832 A | 3/1966 | Renard |
| 3,246,256 A | 4/1966 | Sommers, Jr. |
| 3,303,350 A | 2/1967 | Neff et al. |
| 3,387,298 A | 6/1968 | Kruy |
| 3,527,949 A | 9/1970 | Huth |
| 3,571,753 A | 3/1971 | Saunders |
| 3,755,698 A | 8/1973 | Nicholson et al. |
| 3,761,621 A | 9/1973 | Vollmeyer et al. |
| 3,846,717 A | 11/1974 | Fleming |
| 3,967,210 A | 6/1976 | Aumann |
| 4,028,562 A | 6/1977 | Zuleeg |
| 4,037,252 A | 7/1977 | Janssen |
| 4,365,212 A | 12/1982 | Gentile et al. |
| 4,425,647 A | 1/1984 | Collins et al. |
| 4,459,591 A | 7/1984 | Haubner et al. |
| 4,560,949 A | 12/1985 | Young |
| 4,599,549 A | 7/1986 | Mutoh et al. |
| 4,641,317 A | 2/1987 | Fullerton |
| 4,743,906 A | 5/1988 | Fullerton |
| 4,862,160 A | 8/1989 | Ekchian et al. |

(Continued)

FOREIGN PATENT DOCUMENTS

DD    94 855    1/1973

(Continued)

OTHER PUBLICATIONS

Abell, E., "Gated Oscillator Emulates a Flip-Flop", EDN Access, pp. 1-2, Mar. 16, 1995.

(Continued)

*Primary Examiner*—Dac Ha
*Assistant Examiner*—Jaison Joseph
(74) *Attorney, Agent, or Firm*—Townsend and Townsend and Crew LLP (57) ABSTRACT

Pulse width modulation of a digital signal using a nonlinear type of pulse generator is described. The nonlinear pulse generator is characterized by its transfer characteristic which has alternating stable and unstable operating regions. The pulse width modulated signal is generated by varying the operating point between among the unstable and stable operating regions.

26 Claims, 9 Drawing Sheets

U.S. PATENT DOCUMENTS

| | | | |
|---|---|---|---|
| 5,012,244 A | 4/1991 | Wellard et al. | |
| 5,107,264 A | 4/1992 | Novof | |
| 5,170,274 A | 12/1992 | Kuwata et al. | |
| 5,274,375 A | 12/1993 | Thompson | |
| 5,337,054 A | 8/1994 | Ross et al. | |
| 5,339,053 A | 8/1994 | Lux et al. | |
| 5,459,749 A | 10/1995 | Park | |
| 5,461,643 A | 10/1995 | La Rosa et al. | |
| 5,532,641 A | 7/1996 | Balasubramanian et al. | |
| 5,539,761 A | 7/1996 | Golub et al. | |
| 5,610,907 A | 3/1997 | Barrett | |
| 5,640,427 A | 6/1997 | Ranish | |
| 5,691,723 A | 11/1997 | King et al. | |
| 5,757,301 A | 5/1998 | Kuo et al. | |
| 5,764,702 A | 6/1998 | Caiaffa | |
| 5,777,507 A | 7/1998 | Kaminishi et al. | |
| 5,789,992 A | 8/1998 | Moon | |
| 5,812,081 A | 9/1998 | Fullerton | |
| 5,832,035 A | 11/1998 | Fullerton | |
| 5,892,701 A | 4/1999 | Huang et al. | |
| 5,901,172 A | 5/1999 | Fontana et al. | |
| 6,023,672 A | 2/2000 | Ozawa | |
| 6,038,265 A * | 3/2000 | Pan et al. | 375/316 |
| 6,044,113 A | 3/2000 | Oltean | |
| 6,060,932 A | 5/2000 | Devin | |
| 6,087,904 A | 7/2000 | Wen | |
| 6,259,390 B1 | 7/2001 | Joe | |
| 6,275,544 B1 | 8/2001 | Aiello et al. | |
| 6,292,067 B1 | 9/2001 | Sasabata et al. | |
| 2001/0020907 A1 | 9/2001 | Joe et al. | |

FOREIGN PATENT DOCUMENTS

| | | |
|---|---|---|
| DE | 2459531 A1 | 7/1976 |
| DE | 2602794 A1 | 7/1977 |
| DE | 19809334 A1 | 9/1999 |
| FR | 1 428 262 | 7/1966 |
| GB | 1036328 | 7/1966 |
| JP | 11074766 | 3/1999 |
| WO | WO 00/5987 A2 | 2/2000 |
| WO | WO 01/31868 A1 | 5/2001 |
| WO | WO 02/13385 A1 | 2/2002 |

OTHER PUBLICATIONS

Gallerani, A., "Oscillator Meets Three Requirements", EDN Access, pp. 119-120, Dec. 3, 1998.

L. Goras et al., "On Linear Inductance- and Capacitance-Time Conversions Using NIC-Type Configuration," IEEE Transactions on Industrial Electronics, vol. 40, No. 5 pp. 529-531 (Oct. 1993).

V.H. Jakubaschk, "das Große Elektronoikbastelbuch," Deutscher Militärverlag, Leipzig, pp. 206-209 (1968).

James P. Keener, Analog Circuitry for the van der Pol and FitzHugh—Nagumo Equations, IEEE 1983, pp. 1011-1015.

U. Tietze et al., "Halbleiter-Schaltungstechnik, Fünfte überarbeitete Auflage," Springer-Verlag, Berlin Heidelberg, New York, pp. 255-258 (1980).

Patarasen, S. et al., Maximum-Likelihood Symbol Synchronization and Detection of OPPM Sequences, IEEE Transactions on Communications, New York, US, Jun. 94, pp. 9, vol. 42, No. 6.

Sen et al., Integration of GaAx/A1As Resonant Tunneling Diodes for Digital and Analog Applications with Reduced Circuit Complexity, Oct. 13-16, 1987.

D. Wang et al., "Image Segmentation Based on Oscillatory Correlation," Neural Computation, vol. 9, pp. 805-836 (1997).

Gang Li et al., "Performance of a Ratio-Threshold Diversity Combining Scheme in FFH/FSK Spread Spectrum Systems in Partial Band Noise Interference," Department of Electrical and Computer Engineering, and Communication Research Centre, IEEE 1992, pp. 0672-0676.

Gang Li et al., "Maximum-Likelihood Diversity Combining in Partial-Band Noise Interference Channel," Department of Electrical and Computer Engineering, and Communication Research Centre, IEEE 1993, pp. 507-511.

* cited by examiner

| $D_2$ | $D_1$ | $S_1$ | $S_2$ | $S_3$ | $S_4$ |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

METHOD AND APPARATUS FOR GENERATING PULSE WIDTH MODULATED WAVEFORMS

CROSS-REFERENCES TO RELATED APPLICATIONS

This application claims the benefit of U.S. Provisional Application No. 60/338,781, filed Nov. 5, 2001, entitled "Method and Apparatus for Generating Pulse Width Modulated Waveforms."

This application is related to commonly-owned U.S. Pat. No. 6,259,390. This application is further related to the following commonly owned and co-pending applications: U.S. application Ser. No. 09/805,845, filed Mar. 13, 2001, entitled "Circuitry with Resistive Input Impedance for Generating Pulses From Analog Waveforms" and U.S. application Ser. No. 09/839,810, filed Apr. 19, 2001, entitled "Method and Apparatus for Generating Pulses Using Dynamic Transfer Function Characteristics," both of which are herein incorporated by reference for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This invention relates generally to signal modulation and more specifically to the generation of pulse-width-modulated signals.

In a communication system, data is typically transmitted in the form of modulated signals. Pulse Width Modulation (PWM) is an important category of modulation techniques. PWM is based on the use of a pulsed signal in which pulses of varying width represent different data being transmitted. Pulse width modulated signals also have widespread applications in many sectors of technology other than communications. For example, servo motor controllers, DC/AC converters, switching power supplies and dimming circuits are just some of the applications in which pulse width modulated signals can be used.

The basic blocks include a modulating signal source which is a sine wave generator and a free running sawtooth generator. The frequency of the sawtooth signal is several times higher than that of the sine wave and it is usually derived from a very stable frequency oscillator. The pulse width modulated signal is generated by comparing the amplitude of the sine wave and the sawtooth wave using a high gain voltage comparator.

Figure 9:
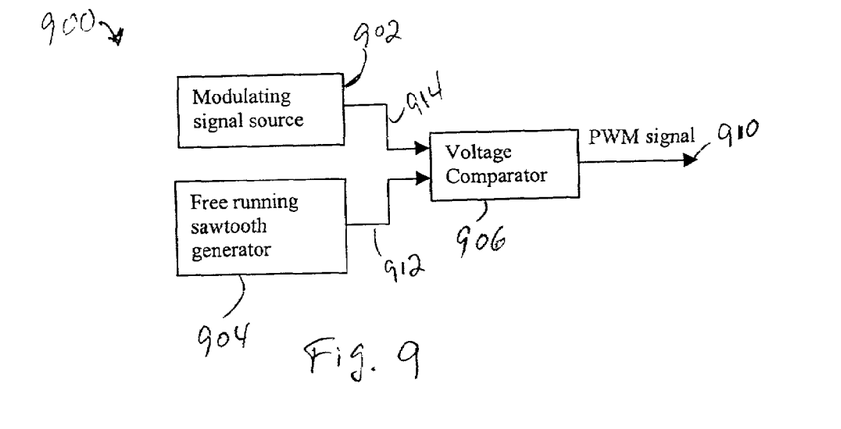
FIG. 9 shows a conventional pulse width modulation device.

FIG. 9 is a block diagram of a typical prior art PWM generating circuit 900. The basic components include a modulating signal source 902 which represents the signal to be transmitted by PWM, and a free running sawtooth generator 904. The frequency of the sawtooth signal 912 produced by the sawtooth generator is several times that of the sine wave signal 914. The sawtooth signal is usually derived from a very stable frequency oscillator. The pulse width modulated signal 910 is generated by comparing the amplitude of the sine wave and the sawtooth wave using a high gain voltage comparator 906.

Figure 10A:
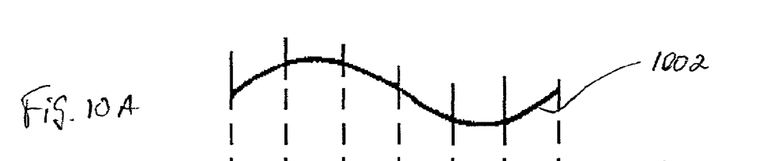
FIGS. 10A–10C shows sequence for producing a pulse width modulated signal by conventional techniques.
Figure 10B:
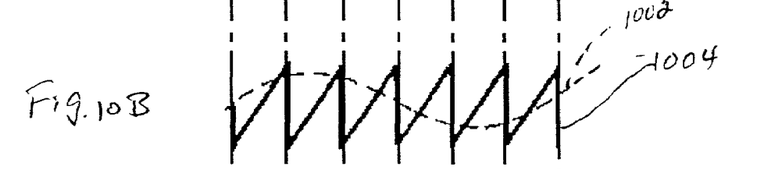
Figure 10C:
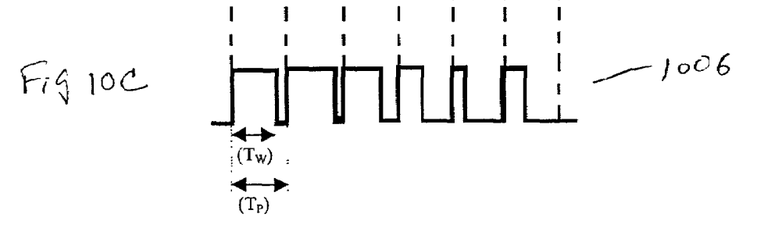

FIGS. 10A–10C illustrate an analog input waveform 1002 applied to a conventional technique for generating PWM signals. The analog input waveform 1002 represents the data to be transmitted. FIG. 10B illustrates a sawtooth waveform 1004 generated by a free running sawtooth generator. FIG. 10C illustrates a pulse width modulated signal 1006 generated by comparing the amplitude of the analog input waveform 1002 and the sawtooth waveform 1004, according to this conventional technique. It can be seen in FIG. 10B that when the amplitude of the analog input waveform 1002 exceeds the amplitude of the sawtooth waveform 1004, the comparator 906 outputs a high level signal shown in FIG. 10C. Otherwise, the comparator outputs a low level signal. Note that a duty cycle can be defined as the ratio of the pulse width (TW) to the pulse period (TP) shown in FIG. 10C.

This technique faces a number of difficulties in implementation. For example, the free running sawtooth generator 904 must be accurately controlled to operate at a frequency several times higher than that of the analog input wavefonn wave 1002. Also, the average amplitude of both the input waveform 1002 and the sawtooth waveform 1004 must be carefully matched. If there is a significant mismatch, the comparator output could be diminished due to a resulting DC component.

Conventional techniques also exist for generating PWM signals where the data to be transmitted is digital data. Typically, such techniques use an oversampling clock in connection with a counter and/or appropriate combinatorial logic to generate a PWM signal. However, the accuracy of the PWM signal is directly dependent upon the oversampling rate provided by oversampling clock. The requirement for an oversampling clock of sufficiently high rate significantly increases the cost of devices implementing such techniques.

U.S. Pat. No. 5,789,992 describes a PWM method using purely digital logic circuit. The method basically generates a series of PWM component signals. These component signals will be operated with the digital word input using AND and OR logic operations to produce a PWM signal that corresponds to the digital word. It can be appreciated that this method requires an oversampling clock in order to produce a sufficiently accurate PWM signal that is useful.

U.S. Pat. No. 6,044,113 describes a circuit and method for generating digital PWM using an oversampling clock signal and Voltage-to-Frequency Conversion (VFC). The VFC converts an analog input signal to produce a digital word. This digital word, along with the oversampling clock, is provided to a counter to generate a PWM signal that is proportional to the digital word.

Clearly, it can be seen that there is room for improvement over prior art PWM techniques.

BRIEF SUMMARY OF THE INVENTION

A method and apparatus for modulating a digital data stream to produce a pulse width modulated signal includes producing a first intermediate signal based on the digital data stream. The intermediate signal is applied to a nonlinear circuit. In response, the nonlinear circuit produces a pulse width modulated signal representative of the digital data stream.

BRIEF DESCRIPTION OF THE DRAWINGS

The teachings of the present invention can be readily understood by considering the following detailed description in conjunction with the accompanying drawings.

DETAILED DESCRIPTION OF THE INVENTION

Figure 1:
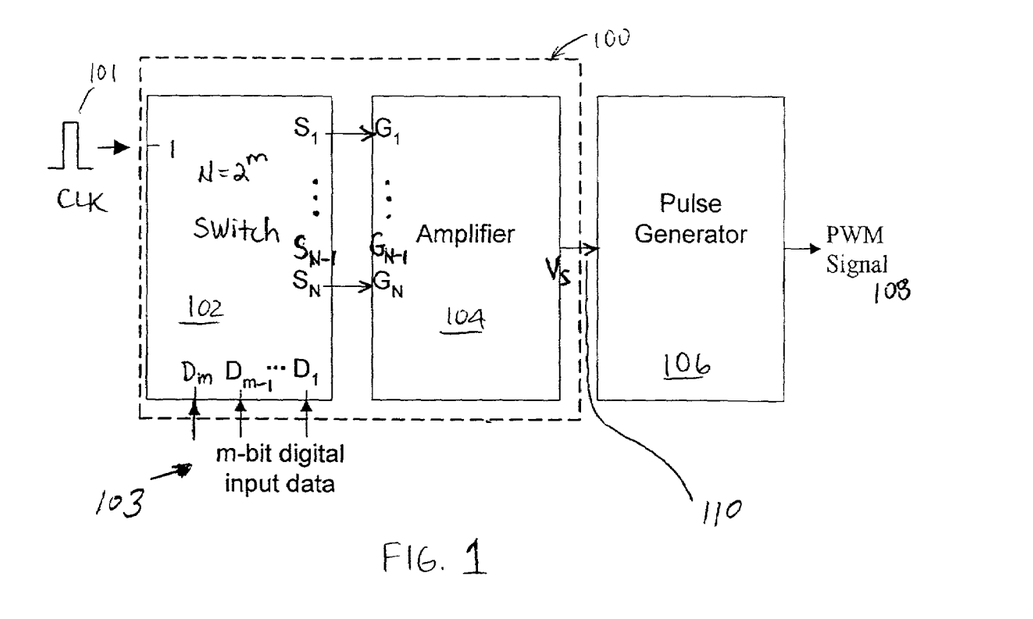
FIG. 1 shows a pulse generation apparatus in accordance with an illustrative embodiment of the present invention.

FIG. 1 shows a generalized high level functional block diagram of an illustrative embodiment of a pulse width modulated (PWM) signal generating device in accordance with the present invention. As shown in the figure, a digital input 103 is provided to an input of a conversion block 100. The input comprises a digital data stream of single bits (M=1) or M-bit data. A pulse signal 101 is provided to another input of the conversion block 100. The pulse can be synchronized with the clocking of the M-bit digital input. In one embodiment, the pulse 101 can be derived from a clock signal (not shown), or it can be the clock signal itself. The conversion block outputs an intermediate signal 110 to serve as a control signal to operate a nonlinear pulse generator circuit 106. The nonlinear circuit outputs a PWM signal 108.

As shown in FIG. 1, the conversion block 100 contains a switch structure 102. The switch structure 102 receives the digital input 103 at $D_1$ to $D_M$ and the pulse signal 101. The pulse signal is switched to one of a number of outputs $S_1$ to $S_N$ based on the M-bit data. The outputs of the switch structure feed into an amplifier module 104 having an input port $G_1$ to $G_N$ for each of the switch outputs. An output of the amplifier module constitutes the output 110 of the conversion block.

From the description to follow, it will be appreciated that the conversion block 100 can be implemented by any of a variety of known, well-understood, conventional digital design methodologies. The conversion block might be appropriately implemented using a digital signal processing (DSP) architecture, any of a variety of field programmable gate array (FPGA) architectures and the like, or even analog circuits and combinations of analog and digital circuitry. The specific implementation will depend on factors not relevant to the practice of the present invention.

Figure 2:
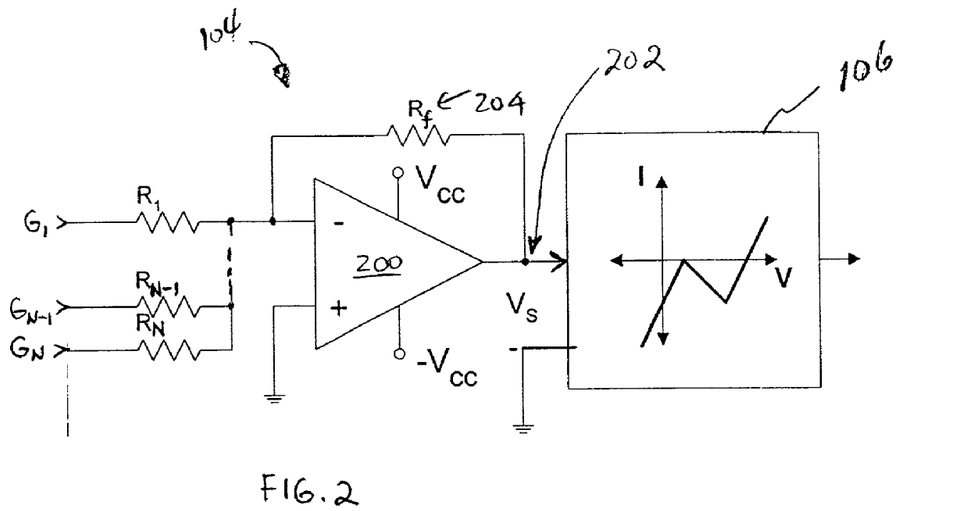
FIG. 2 shows an amplifier component of the apparatus of FIG. 1.

FIG. 2 shows an illustrative example of the amplifier 104. In this particular example, the amplifier comprises a summing amplifier configuration. Each input port $G_n$ provides a gain determined by $$G_n = \frac{R_f}{R_n},$$

where n=1, 2, 3, . . . N. The active component 200 can be a conventional op-amp (e.g., LM7171). In this particular implementation, the op-amp is biased with a +15 V and −15 V DC supply. The components value are $R_f$=510 Ω, $R_1$=680 Ω, $R_2$=100 Ω, $R_3$=20 Ω, and $R_4$=1 Ω. Of course, other appropriate gain settings and component values can be used. An output 202 of the amplifier 104 feeds into the pulse generator circuit 106.

Figure 3:
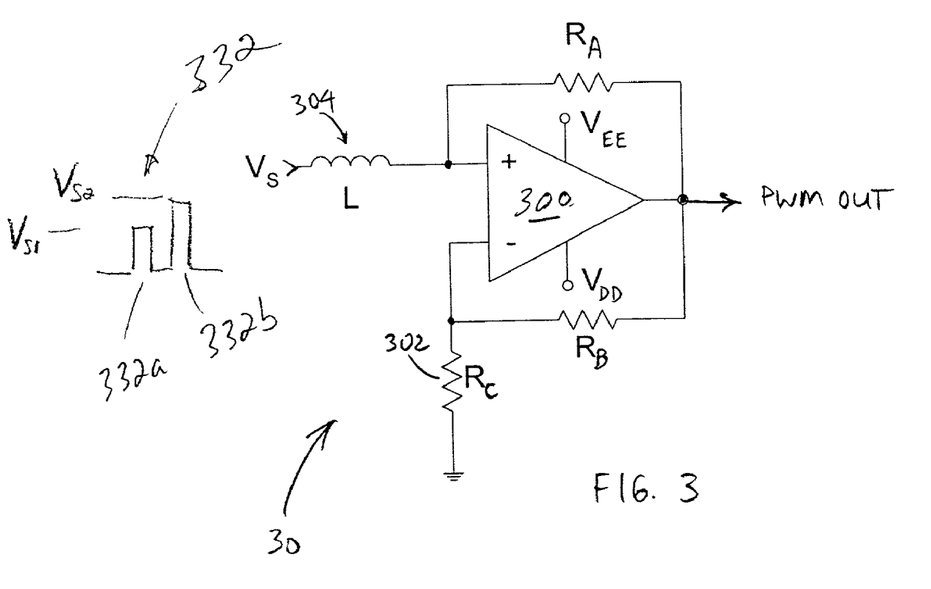
FIGS. 3 and 3A illustrate a nonlinear circuit component used in accordance with the present invention.
Figure 3A:
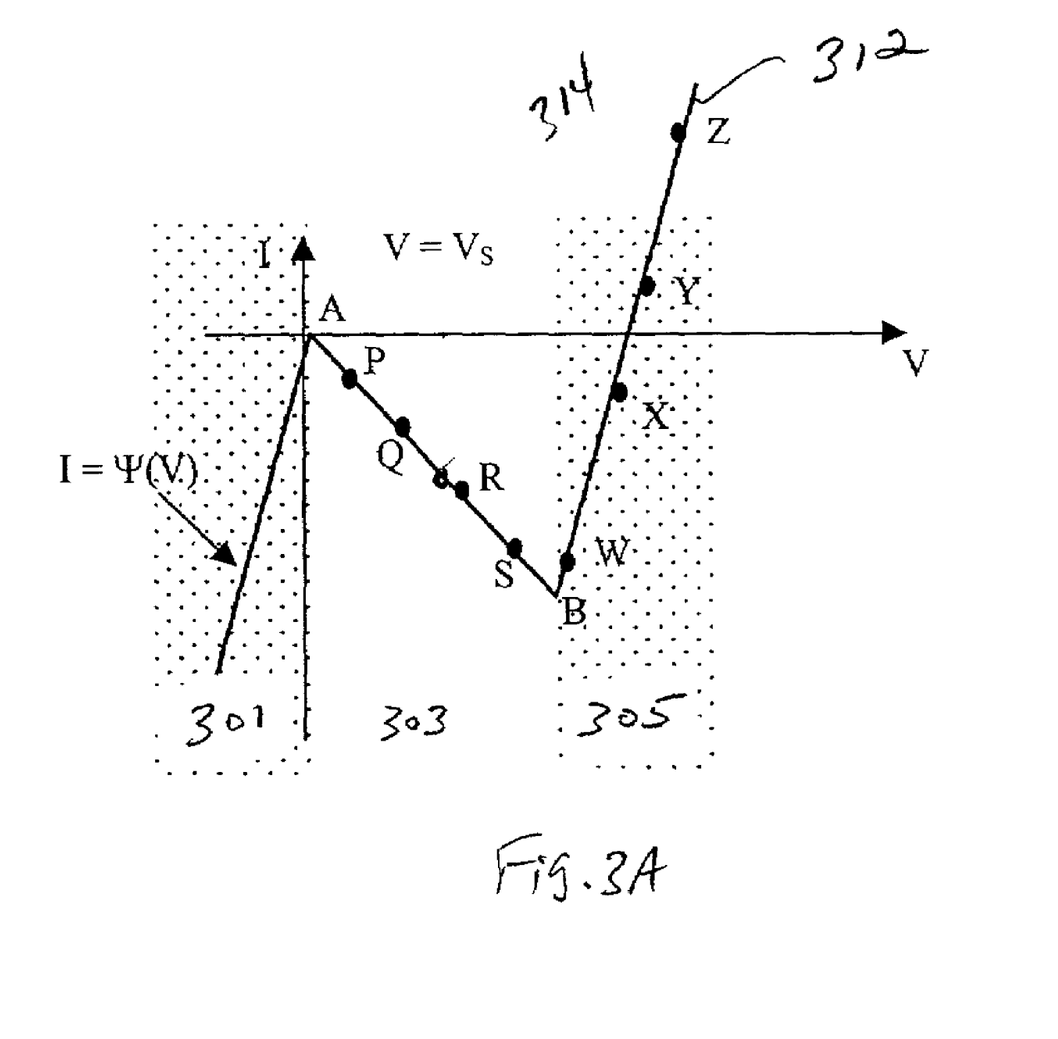

FIGS. 3 and 3A show respectively a circuit 30 and a corresponding transfer function provided in accordance with an embodiment of the present invention. The circuit 30 is an example of an implementation of the pulse generator 106 shown in FIG. 1. The circuit can be constructed with an op-amp 300 and the circuit components shown. The op-amp used in this particular implementation is an LM7171. The DC voltages applied to the op-amp are VCC=4.25 V and VDD=−1.5 V. The components values are L=10 mH, $R_A$=1 kΩ, $R_B$=56 Ω, and $R_C$=220 Ω. The operation of the circuit is explained below. Additional discussion is provided in commonly owned U.S. Pat. No. 6,259,390.

FIG. 3A shows a transfer function, I=Ψ(V), of the circuit 30. For the purposes of the present invention, the "transfer function" (characteristic) of a circuit refers to the relationship between any two state variables of a circuit. Electronic circuits are typically characterized by their I-V curves, relating the two state variables of current and voltage. Such curves indicate how one state variable (e.g., current) changes as the other state variable (voltage) varies. As can be seen in FIG. 3A, the transfer function for the circuit 30 includes a portion which lies within a region 303, referred to herein as an "unstable" region. The unstable region is bounded on either side by regions 301 and 305, each of which is herein referred to as a "stable" region.

The circuit 30 has an associated "operating point" 314 which is a location on the transfer function 312. The nature of the output of the circuit depends on the location of its operating point. If the operating point is positioned along the portion of the transfer function that lies within region 303, the output of the circuit will exhibit an oscillatory behavior. It is for this reason that the region 303 is referred to as an unstable operating region. If the operating point is positioned along the portions of the transfer function that lie within either of regions 301 and 305, the output of the circuit will exhibit a generally time-varying but otherwise non-oscillatory behavior. It is for this reason that regions 301 and 305 are referred to as stable operating regions.

The operating point 314 of the circuit is a function of the signal supplied to the input of the circuit 30. FIG. 3 shows such a control signal 332, having a first region 332a and a second region 332b. A line V=$V_S$ is shown in FIG. 3a to illustrate the relation of the amplitude of the control signal 332 to the transfer function 312. The intersection of line V=$V_S$ with the transfer function sets the operating point 314 of the circuit 30. Thus, as the control signal amplitude varies between amplitudes $V_{S1}$ and $V_{S2}$, it can be seen that the operating point of the circuit 30 moves between its stable and unstable operating regions, with corresponding changes in the behavior of the circuit output.

Figure 4:
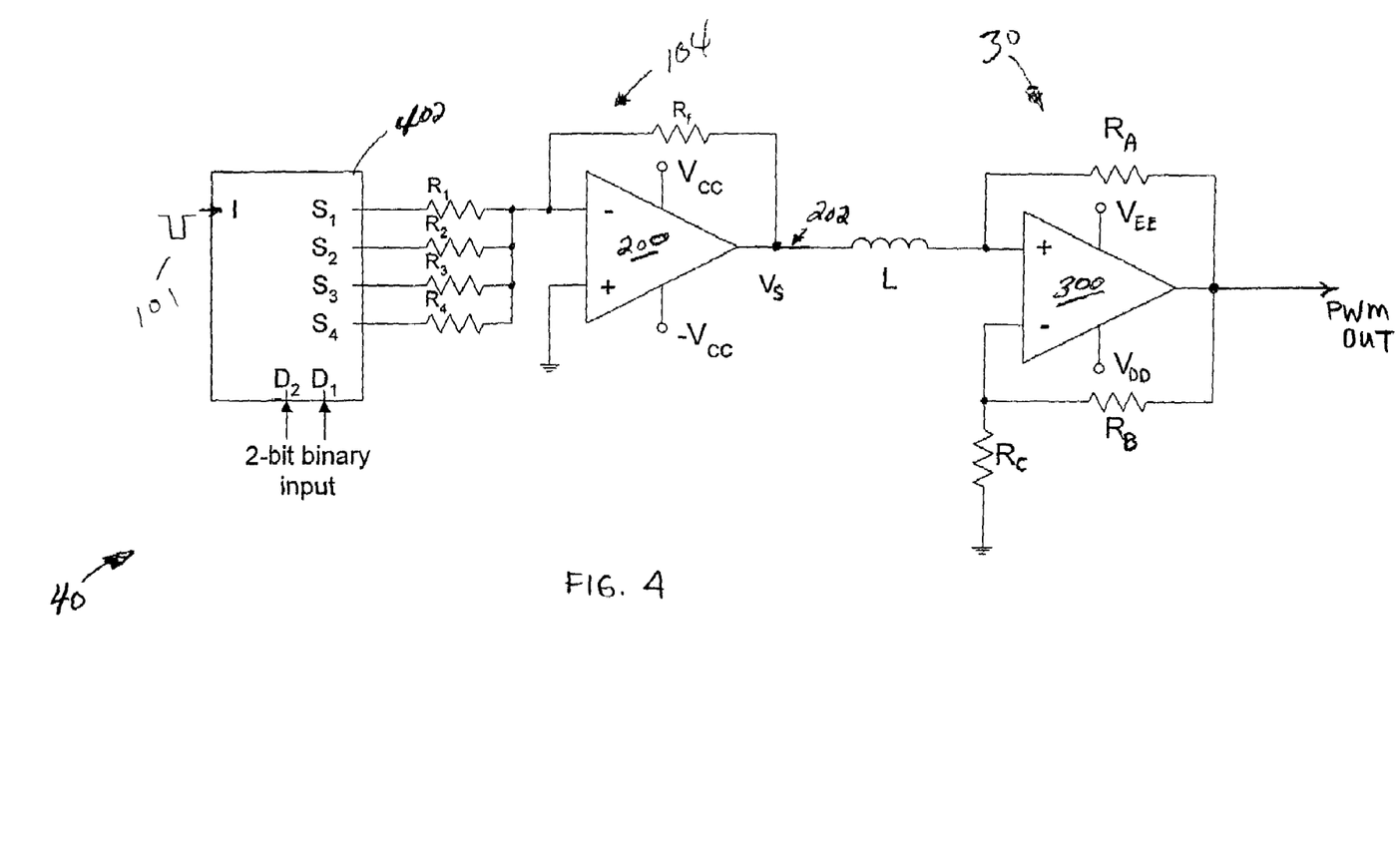
FIG. 4 details a particular implementation of an embodiment of the present invention.

FIG. 4 shows a particular implementation of the embodiment of the invention shown in FIG. 1. The amplifier 104 is the example implementation shown in FIG. 2. The pulse generator 106 is the circuit 30 shown in FIG. 3.

The particular switch structure 102 shown in FIG. 4 is a one-to-four multiplexer 402, can be constructed using commercially available logic blocks, or from basic logic gates. The multiplexer has four output ports labeled as $S_1$ to $S_4$. This multiplexer is controlled digitally by 2-bit word of binary input through ports $D_1$ and $D_2$. This pulse 101 is synchronized with the clocking in of the 2-bit binary word. The combination of this 2-bit word will determine the internal connection between port I to one of the output ports ($S_1$ to $S_4$).

Figure 5:
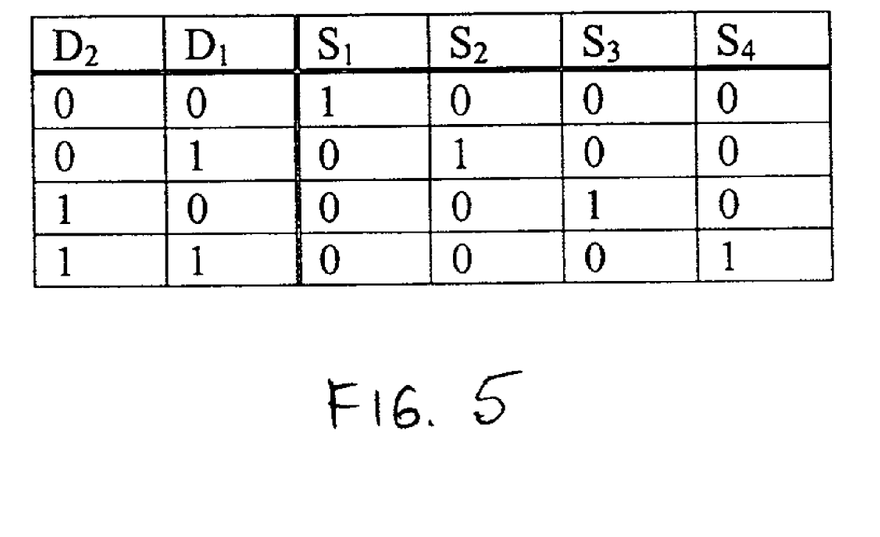
FIG. 5 is a table showing the mapping between input data and output port on the multiplexer shown in FIG. 4.

The output ports $S_1$ to $S_4$ are connected to the summing amplifier 104. As noted earlier, the summing amplifier provides a gain port $G_1$ to $G_4$ for each signal from the switch 402. For example, the summing amplifier will amplify a signal from $S_1$ with a gain of $G_1$, $S_2$ with a gain of $G_2$, etc. Since only one S-port contains the pulse from the port I for any 2-bit word, a pulse with given amplitude will be generated at the output of the summing amplifier. Hence, this particular combination of multiplexer and summing amplifier operates to convert the incoming pulse 101 to a pulse whose amplitude depends on a two-bit digital word. Thus, a data stream can be divided into M-bit data portions which are then represented by a pulse of corresponding amplitude. FIG. 5 shows a table, summarizing this mapping of a data stream into an intermediate signal 202 comprising signal portions represented by pulses of varying amplitude.

The discussion will now turn to two approaches for producing PWM signals in accordance with the present invention.

PWM Using Nonlinear Pulse Generator's Unstable Region

Referring to FIGS. 4 and 3A, if a pulse synchronized with the digital word ($D_2D_1$) is applied to port I, it will be amplified with a gain depending on the digital word combination. For example, if the $D_2D_1$=00, the pulse will be outputted at port $S_1$ (see FIG. 5). The summing amplifier will amplify the pulse by a factor of $-R_f/R_1$. The output of the summing amplifier, which is fed to the nonlinear pulse generator 30 as $V_S$, will determine the position of the operating point along the unstable region 303, thus controlling the operation of the generator. In this example, if $R_1>R_2>R_3>R_4$, then the value of these resistors can be selected such that when a pulse is applied at port I, the operating point is moved to the position P, Q, R, S in FIG. 3A when $D_2D_1$ combinations are 00, 01, 10, 11, respectively.

Figure 6:
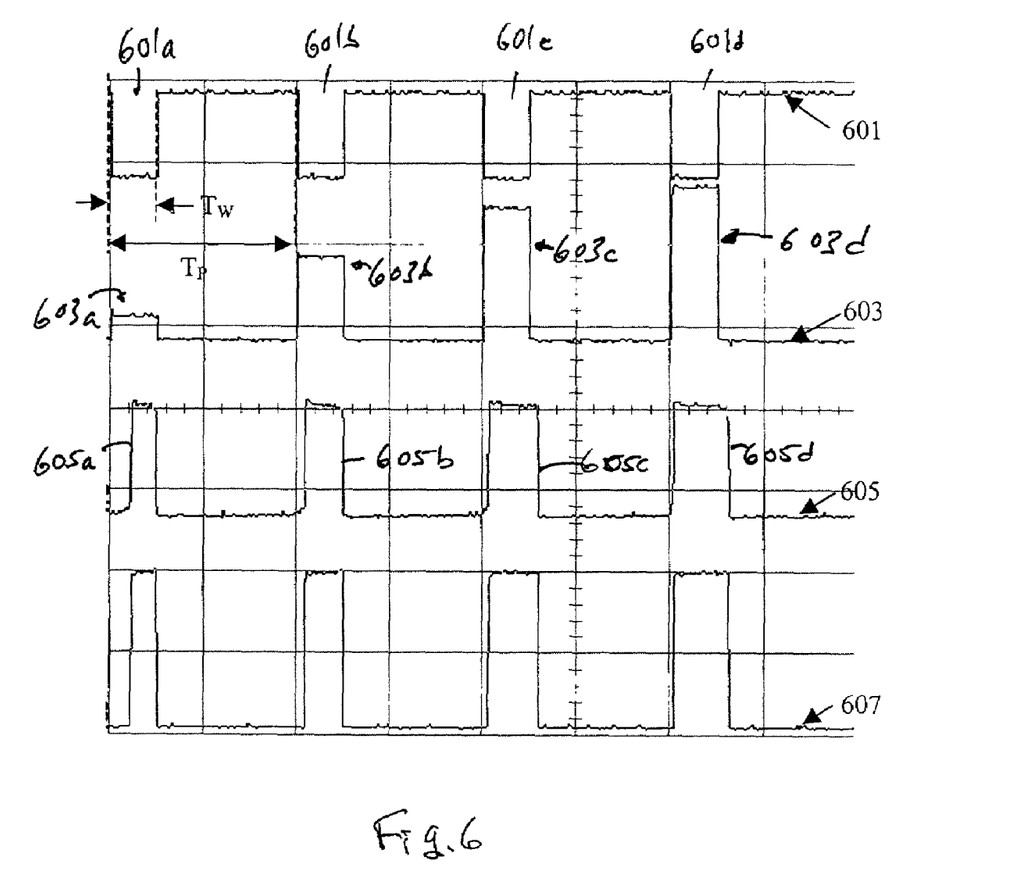
FIGS. 6 and 7 are traces produced by actual experiments performed using the apparatus of the various embodiments of the present invention.

FIG. 6 shows some of the traces obtained from the circuit configuration in FIG. 4, using the unstable region to a generate pulse width modulated signal. Trace 601 is the input pulse 101 applied to input port I in FIG. 4. The pulse has a period $T_P$ and has a width $T_W$ ($T_P<T_W$). As noted above, the input pulse is inverted because of the fact that the summing amplifier will provide the inversion and a gain factor to the pulse. Trace 603 is obtained at the output of summing amplifier which will be used as an input to the nonlinear pulse generator.

Trace 603 shows that each combination of $D_2D_1$ has been input to the switch 402 to produce pulses 603a–603d. This is achieved by controlling the multiplexer using digital word input $D_2D_1$ to direct the input pulse to the desired output port S. The summing amplifier will provide a different gain to different ports. For example, $D_2D_1$ is 00 when the first pulse 601a of trace 601 enters the multiplexer. From FIG. 5, the input pulse is outputted at port $S_1$, and hence this pulse is amplified by a factor of $-R_f/R_1$. When the second pulse 601b of trace 601 enters the multiplexer, $D_2D_1$ is 01. This pulse is outputted at port $S_2$ and amplified by a factor of $-R_f/R_1$. For the third pulse and the fourth pulse of trace 601, $D_2D_1$ is 10 and 11, respectively.

The trace amplitude of the pulses in trace 603 are provided to the circuit of FIG. 3 as $V_S$ to determine the operating point position in the unstable region 303 as shown in FIG. 3A. The larger the amplitude of the pulse, the further away the operating point from A but closer to B. Trace 605 shows the output response, as pulses 605a–605d, of the nonlinear pulse generator. As can be seen, the pulse width of the fourth pulse 605d is much wider than that of the first pulse 605a. This is expected because the operating point for the fourth pulse is closer to B and the operating point for the first pulse is closer to A. Trace 607 is a result from passing the output of the nonlinear pulse generator (trace 605) to a comparator (not shown). This might be desirable if the pulses produced at 605 were not sufficiently square. Passing the signal through a typical comparator circuit would produce square pulses.

It is noted that the width of the pulse 101 that is applied to port I of the switch 402 (FIG. 4) can be adjusted accordingly so that when the circuit 30 is driven into the unstable operating region to a position P-S on the transfer curve 312, the output of the circuit produces a single pulse. For example, this determination can be readily made by simply adjusting the width of pulse 101 and watching the resulting output (e.g., trace 605) of the circuit 30.

It is further noted that the rising edge or falling edge of the pulse generated is not synchronized to either the rising or the falling edge of the input pulse (601, FIG. 6). However, it is still within the input pulse period $T_P$. If such synchronization with the input pulse is desirable, then the second method described below can be used.

PWM Using Nonlinear Pulse Generator's Stable Region

The first and second stable regions 301 and 305 are shown in FIG. 3A. The first stable region, as in the first method, is used to rest the operating point 314 of the circuit 30 when a pulse is not present. When a pulse is present, the operating point will be moved to the second stable region 305. As can be seen in FIG. 3A, this can be achieved by properly adjusting the amplitude of the pulses produced by amplifier 104; in particular adjusting the gain values $G_1$–$G_N$.

In the second stable region 305, the further away the operating point from B, the wider the pulse generated at the output of the nonlinear pulse generator. The reason is that the trajectory time spent in the second stable region is longer when operating point is moved further away from B. This can be observed in the traces shown in FIG. 7. Thus, the circuit 30 is alternately operated between a first stable region (e.g., 301) and a second stable region (e.g., 305), wherein the traversal of the operating point between the two stable regions results in the circuit producing a pulse output.

Referring to FIGS. 4 and 3A, if a pulse synchronized with the digital control bit ($D_2D_1$) is applied to port I, it will be amplified with a gain depending on the control bit combination. For example, if the $D_2D_1$=00, the pulse will be outputted at port $S_1$ (see FIG. 5). The summing amplifier will amplify the pulse by a factor of $-R_f/R_1$. The output of the summing amplifier, which is the same as $V_S$ of the nonlinear pulse generator, will determine the position of the operating point along the second stable region 305. In this example, if $R_1>R_2>R_3>R_4$, then the value of these resistors can be selected such that when a pulse is applied at port I, the operating point is moved to the position W, X, Y, Z when $D_2 D_1$ combinations are 00, 01, 10, 11, respectively.

Figure 7:
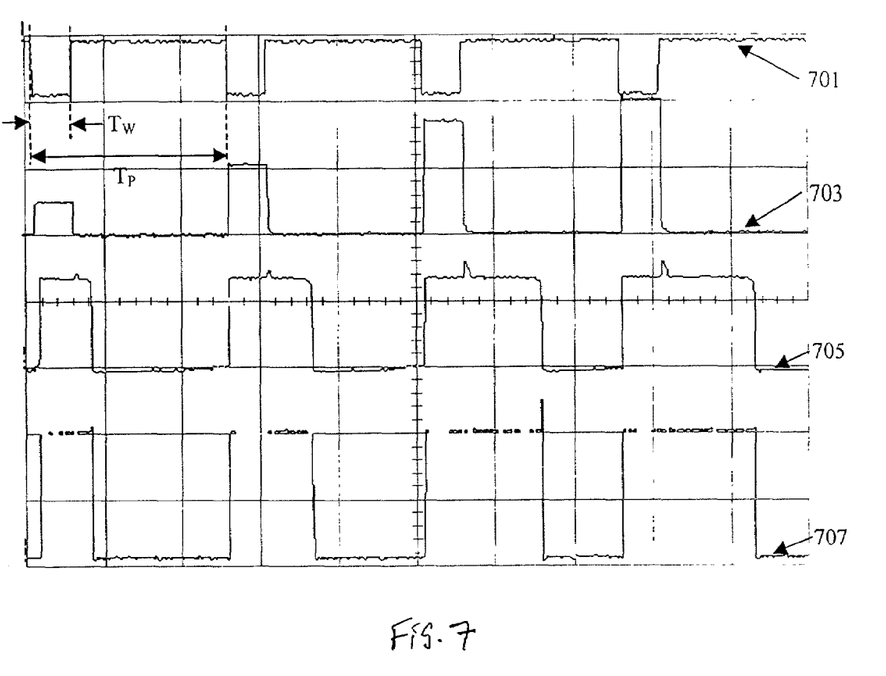

FIG. 7 shows traces obtained from circuit configuration in FIG. 4 using the second stable region 305 to generate the pulse width modulated signal. Trace 701 is the input pulse applied to input port D in FIG. 4. The pulse has a period $T_P$ and has a width $T_W$ ($T_P$<$T_W$). The input pulse in this case is inverted because of the fact that the summing amplifier will provide the inversion and a gain factor to the pulse.

Trace 703 is obtained at the output of summing amplifier which will be used as an input to the nonlinear pulse generator. Note that the input pulse has been inverted and gone through different amplification factor. This is achieved by controlling the multiplexer using digital input $D_2D_1$ to direct the input pulse to the desired output port S. The summing amplifier will provide a different gain to different port. For example, $D_2D_1$ is 00 when the first pulse of trace 701 enters the multiplexer. From FIG. 5, the input pulse is outputted at port $S_1$, and hence this pulse is amplified by a factor of $-R_f/R_1$. When the second pulse of trace 701 enters the multiplexer, $D_2D_1$ is 01. This pulse is outputted at port $S_2$ and amplified by a factor of $-R_f/R_2$. For the third and the fourth pulse of trace 701, $D_2D_1$ is 10 and 11 respectively.

Trace amplitude of the pulses in trace 703 will determine the operating point position (W, X, Y, Z) in the second stable region 305 as shown in FIG. 3A. The larger the amplitude of the pulse, the further away the operating point from B. Trace 705 shows the output response of the nonlinear pulse generator. The pulse width of the fourth pulse in 705 is much wider than that of the first pulse. This is expected because the operating point for the fourth pulse is much further away from point B compared to that of the first pulse. Trace 707 is a result from passing the output of the nonlinear pulse generator (trace 705) to a comparator (not shown). This can be performed if the particular application calls for additional shaping of the pulses 705.

It is clearly shown in FIG. 7 that the pulse width modulated signal generated using a second stable region of the nonlinear pulse generator is synchronized with the input signal. In this particular example, the rising edge of the pulse width modulated signal is aligned with the falling edge of the input pulse.

In this particular embodiments discussed above, the nonlinear circuit has a transfer function having an N-Shape I-V characteristic. As discussed above, the parameter that moves the operating point 314 is the signal amplitude. It can be appreciated from commonly owned U.S. Pat. No. 6,259,390, that alternative circuit constructions are possible. For example, a circuit with an S-Shape I-V characteristic can also be used to generate PWM signal. In this alternative embodiment, however, the waveform used at the input of the multiplexer would be changed from pulse type waveform to a triangular type waveform. Thus, the M-bit segments of the digital data stream would be mapped in a similar way to corresponding signal portions comprising triangular waveforms having varying slope, where the slope of the waveform is the parameter which controls operation of the circuit.

An advantage of the present invention is it does not need the use of sawtooth wave generator. The dependence on the external clock as the main source of input is not required either. The illustrative embodiments of the invention discussed typically require a simple multiplexer (or similar switching arrangement) and conventional op-amps which are inexpensive and readily available. Memory size, processing speed and resolution problems will not be an issue in this invention since analog ICs are used. Furthermore, in accordance with the illustrative embodiments, the pulse width of the PWM signal can easily be tuned by selecting different resistor values.

What is claimed is:

1. A method for generating a pulse width modulated (PWM) signal comprising:
   receiving a digital data stream comprising a plurality of data portions;
   producing an intermediate signal representative of said digital data stream comprising a plurality of signal portions corresponding to said data portions; and
   controlling an operation of a nonlinear circuit with said intermediate signal to produce said PWM signal representative of said digital data stream, said nonlinear circuit having a transfer function characterized by having an unstable operating region adjacent a first stable operating region and adjacent a second stable operating region, wherein said operation of said nonlinear circuit varies among two or more of said unstable operating region and said first and second stable operating regions in response to said signal portions of said intermediate signal.

2. The method of claim 1 wherein said intermediate signal is a pulse amplitude modulated signal comprising a plurality of pulses having varying amplitudes.

3. The method of claim 1 wherein said intermediate signal is a triangular waveform signal comprising a plurality of triangular waveforms having varying slopes.

4. The method of claim 1 wherein said controlling an operation of said circuit includes operating said circuit in either said unstable operating region or one of said stable operating regions, wherein said circuit produces a pulse as a consequence of operation in said unstable operating region.

5. The method of claim 4 wherein said pulse has a width dependent on a parameter of said signal portions.

6. The method of claim 1 wherein said controlling an operation of said circuit includes alternating operation of said circuit between said first and second stable operating regions, wherein said alternating operation of said circuit produces a pulse.

7. The method of claim 1 wherein said controlling an operation of said circuit includes operating said circuit in said first stable region and operating said circuit in a location in said second stable operating region, said location dependent on a parameter of said signal portions.

8. The method of claim 7 wherein said parameter is a signal amplitude of said signal portion.

9. The method of claim 7 wherein said parameter is a slope of said signal portion.

10. A method for generating pulse width modulated signal comprising;
    receiving a digital signal;
    producing a pulse amplitude modulated signal representative of said digital signal; and
    base on said pulse amplitude modulated signal, producing a pulse width modulated signal representative of said digital signal,
    wherein said producing a pulse width modulated signal includes controlling a nonlinear circuit with said pulse amplitude modulated signal, said nonlinear circuit producing said pulse width modulated signal in response to amplitude variations in said pulse amplitude modulated signal.

11. The method of claim 10 wherein said producing a pulse width modulated signal includes controlling a nonlinear circuit with said pulse amplitude modulated signal, said circuit characterized by a transfer function having an unstable operating region portion adjacent a stable operating region portion, said circuit operating in said stable operating region in an absence of a pulse in said pulse amplitude modulated signal, said circuit operating in a location in said unstable region to produce an output pulse, said location depending on an amplitude of a pulse in said pulse amplitude modulated signal, said output pulse having a pulse width dependent on said location in said operating region.

12. The method of claim 10 wherein said producing a pulse width modulated signal includes controlling a nonlinear circuit with said pulse amplitude modulated signal, said circuit characterized by a transfer function having an unstable operating region portion bounded on each side by a stable operating region portion, said circuit having an operating point that lies on a location on said transfer function,
wherein said pulse amplitude modulated signal drives said operating point between a location in a first stable operating region and a location in a second stable operating region whereby traversal of said operating point from said first stable operating region to said second stable operating region and back to said first stable operating region produces an output pulse.

13. The method of claim 12 wherein said location in said second stable operating region is dependent upon a signal amplitude of said pulse amplitude modulated signal, said output pulse having a pulse width dependent on said location in said second stable operating region.

14. A pulse width modulator comprising:
a signal generator configured to receive a digital data stream and to produce an intermediate signal representative of the digital data stream, said intermediate signal having alternating fist and second signal portions; and
a nonlinear circuit coupled to receive at an input thereof said intermediate signal and having an output to produce output pulses in response to said intermediate signal, said output pulses constituting a pulse width modulated signal,
said nonlinear circuit characterized by a transfer function having an unstable operating region portion bounded on each side by a stable operating region portion, said circuit having an operating point that lies on a location on said transfer function, wherein said nonlinear circuit operates in a first stable operating region in the presence of said first signal portions, wherein said nonlinear circuit operates in said unstable operating or in a second stable operating region in the presence of said second signal portions.

15. The system of claim 14 wherein said signal generator is a pulse amplitude modulator and said intermediate signal is a pulse amplitude modulated signal, wherein said nonlinear circuit is configured to operate in said first stable operating region in the absence of pulses in said pulse amplitude modulated signal and to operate in said unstable operating region in the presence of pulses in said pulse amplitude modulated signal.

16. The system of claim 15 further including operating said circuit in a location in said unstable operating region depending on an amplitude of said pulses in said pulse amplitude modulated signal, wherein a pulse width of an output pulse depends on said location in said unstable operating region.

17. The system of claim 14 wherein said signal generator is a pulse amplitude modulator and said intermediate signal is a pulse amplitude modulated signal, wherein said nonlinear circuit is configured to operate in said first stable operating region in the absence of pulses in said pulse amplitude modulated signal and to operate in said second stable operating region in the presence of pulses in said pulse amplitude modulated signal.

18. The system of claim 17 further including operating said circuit in a location in said second stable operating region depending on an amplitude of said pulses in said pulse amplitude modulated signal, wherein a pulse width of an output pulse depends on said location in said second stable operating region.

19. A method for generating a pulse width modulated (PWM) signal comprising:
providing an analog waveform having a plurality of periodic, variably shaped excitations to a circuit with a variable operating point and having a transfer function characterized by an unstable operating region bounded, at a first reference point, by a first stable operating region and bounded, at a second reference point, by a second stable operating region; and
responsive to the shape of at least one of said excitations, positioning said operating point along said transfer function to operate said circuit to produce at least one output pulse, said output pulse having an output pulse width controlled by positional proximity of said operating point to said first reference point.

20. The method of claim 19 wherein said variably shaped excitations are pulse waveforms having variable amplitudes.

21. The method of claim 19 wherein said variably shaped excitations are triangular waveforms having variable slopes.

22. The method of claim 19 wherein said step of positioning said operating point along said transfer function further comprises:
positioning said operating point within said unstable operating region, wherein said output pulse width is controlled to be wider as said operating point is positioned closer to said first reference point.

23. The method of claim 19 wherein said step of positioning said operating point along said transfer function further comprises:
positioning said operating point within said first stable operating region, wherein said output pulse width is controlled to be wider as said operating point is positioned further away from said first reference point.

24. A pulse width modulated (PWM) signal generator comprising:
means for receiving a digital data stream comprising a plurality of data portions;
means for producing an intermediate signal representative of said digital data stream comprising a plurality of signal portions corresponding to said data portions; and
nonlinear circuit means for producing a pulse width modulated signal in response to said intermediate signal, said circuit means having a transfer function characterized by having an unstable operating region adjacent a first stable operating region and adjacent a second stable operating region, wherein said operation of said nonlinear circuit varies among two or more of said unstable operating region and said first and second stable operating regions in response to said signal portions of said intermediate signal.

25. The PWM signal generator of claim 24 wherein said intermediate signal is a pulse amplitude modulated signal.

26. The PWM signal generator of claim 24 wherein said intermediate signal comprises triangular waveforms signal.

* * * * *